United States Patent
Ramachandran et al.

(10) Patent No.: US 9,127,360 B2
(45) Date of Patent: Sep. 8, 2015

(54) EPITAXIAL CHAMBER WITH CROSS FLOW

(75) Inventors: Balasubramanian Ramachandran, Santa Clara, CA (US); Errol Antonio C. Sanchez, Tracy, CA (US); Nyi O. Myo, San Jose, CA (US); Kevin Joseph Bautista, San Jose, CA (US); Harpreet Singh Juneja, San Jose, CA (US); Zuoming Zhu, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 872 days.

(21) Appl. No.: 12/887,647

(22) Filed: Sep. 22, 2010

(65) Prior Publication Data
US 2011/0174212 A1    Jul. 21, 2011

Related U.S. Application Data

(60) Provisional application No. 61/248,585, filed on Oct. 5, 2009.

(51) Int. Cl.
  *C30B 25/14* (2006.01)
  *C23C 16/455* (2006.01)
  *H01L 21/02* (2006.01)

(52) U.S. Cl.
  CPC ......... *C23C 16/455* (2013.01); *C23C 16/45523* (2013.01); *C30B 25/14* (2013.01); *H01L 21/0262* (2013.01); *H01L 21/02532* (2013.01); *H01L 21/02573* (2013.01)

(58) Field of Classification Search
  USPC .......................... 117/200, 201, 86, 90, 99, 104
  See application file for complete search history.

(56) References Cited

U.S. PATENT DOCUMENTS

| | | | |
|---|---|---|---|
| 6,399,510 B1 | 6/2002 | Riley et al. | |
| 6,486,081 B1* | 11/2002 | Ishikawa et al. | 438/788 |
| 7,396,415 B2 | 7/2008 | Arena et al. | |
| 2006/0180082 A1 | 8/2006 | Iwamoto et al. | |
| 2006/0196420 A1* | 9/2006 | Ushakov et al. | 118/715 |
| 2008/0248200 A1* | 10/2008 | Arena et al. | 427/255.28 |

(Continued)

FOREIGN PATENT DOCUMENTS

| | | |
|---|---|---|
| JP | 54-144867 | 11/1979 |
| JP | 62-21869 B2 | 5/1987 |

(Continued)

OTHER PUBLICATIONS

International Search Report and Written Opinion mailed May 19, 2011 for PCT Application No. PCT/US2010/050593.

*Primary Examiner* — Robert M Kunemund
(74) *Attorney, Agent, or Firm* — Moser Taboada; Len Linardakis

(57) ABSTRACT

Methods and apparatus for processing a substrate are provided herein. In some embodiments, an apparatus for processing a substrate includes a process chamber having a substrate support disposed therein to support a processing surface of a substrate at a desired position within the process chamber; a first inlet port to provide a first process gas over the processing surface of the substrate in a first direction; a second inlet port to provide a second process gas over the processing surface of the substrate in a second direction different from the first direction, wherein an azimuthal angle measured between the first direction and the second direction with respect to a central axis of the substrate support is up to about 145 degrees; and an exhaust port disposed opposite the first inlet port to exhaust the first and second process gases from the process chamber.

18 Claims, 3 Drawing Sheets

(56) References Cited

U.S. PATENT DOCUMENTS

2009/0163042 A1 6/2009 Tseng et al.
2014/0079376 A1 3/2014 Tseng et al.

FOREIGN PATENT DOCUMENTS

| | | |
|---|---|---|
| JP | 05-121337 | 5/1993 |
| JP | 09-115837 | 5/1997 |
| JP | 10-032169 | 2/1998 |
| JP | 11-097361 | 4/1999 |
| JP | 11-102871 | 4/1999 |
| JP | 2000-349030 | 12/2000 |
| JP | 2003-086524 A | 3/2003 |
| KR | 10-2008-0023418 A | 3/2008 |
| KR | 10-2009-0051984 A | 5/2009 |

* cited by examiner

EPITAXIAL CHAMBER WITH CROSS FLOW

CROSS-REFERENCE TO RELATED APPLICATIONS

This application claims benefit of U.S. provisional patent application Ser. No. 61/248,585, filed Oct. 5, 2009, which is herein incorporated by reference.

FIELD

Embodiments of the present invention generally relate to methods and apparatus for processing a substrate.

BACKGROUND

In some processes, such as epitaxial deposition of a layer on a substrate, process gases may be flowed across a substrate surface in the same direction. For example, the one or more process gases may be flowed across a substrate surface between an inlet port and an exhaust port disposed on opposing ends of a process chamber to grow an epitaxial layer atop the substrate surface.

Typically, conventional wisdom is that temperature is by far the predominant variable for controlling film thickness. As such, temperature control of the substrate and/or of the process environment is utilized to attempt to control film thickness deposited on the substrate.

The inventors have provided herein improved methods and apparatus for processing substrates.

SUMMARY

Methods and apparatus for processing a substrate are provided herein. In some embodiments, an apparatus for processing a substrate includes a process chamber having a substrate support disposed therein to support a processing surface of a substrate at a desired position within the process chamber; a first inlet port to provide a first process gas over the processing surface of the substrate in a first direction; a second inlet port to provide a second process gas over the processing surface of the substrate in a second direction different from the first direction, wherein an azimuthal angle measured between the first direction and the second direction with respect to a central axis of the substrate support is up to about 145 degrees; and an exhaust port disposed opposite the first inlet port to exhaust the first and second process gases from the process chamber.

In some embodiments, a method for depositing a layer on a substrate includes flowing a first process gas across a processing surface of a substrate in a first direction; flowing a second process gas across the processing surface of the substrate in a second direction different from the first direction, wherein an azimuthal angle measured between the first direction and the second direction with respect to a central axis of the substrate is up to about 145 degrees; and depositing a layer on the substrate that is at least partially formed from a flow interaction of the first and second process gases on the substrate. Other embodiments and variations are disclosed below in the detailed description.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
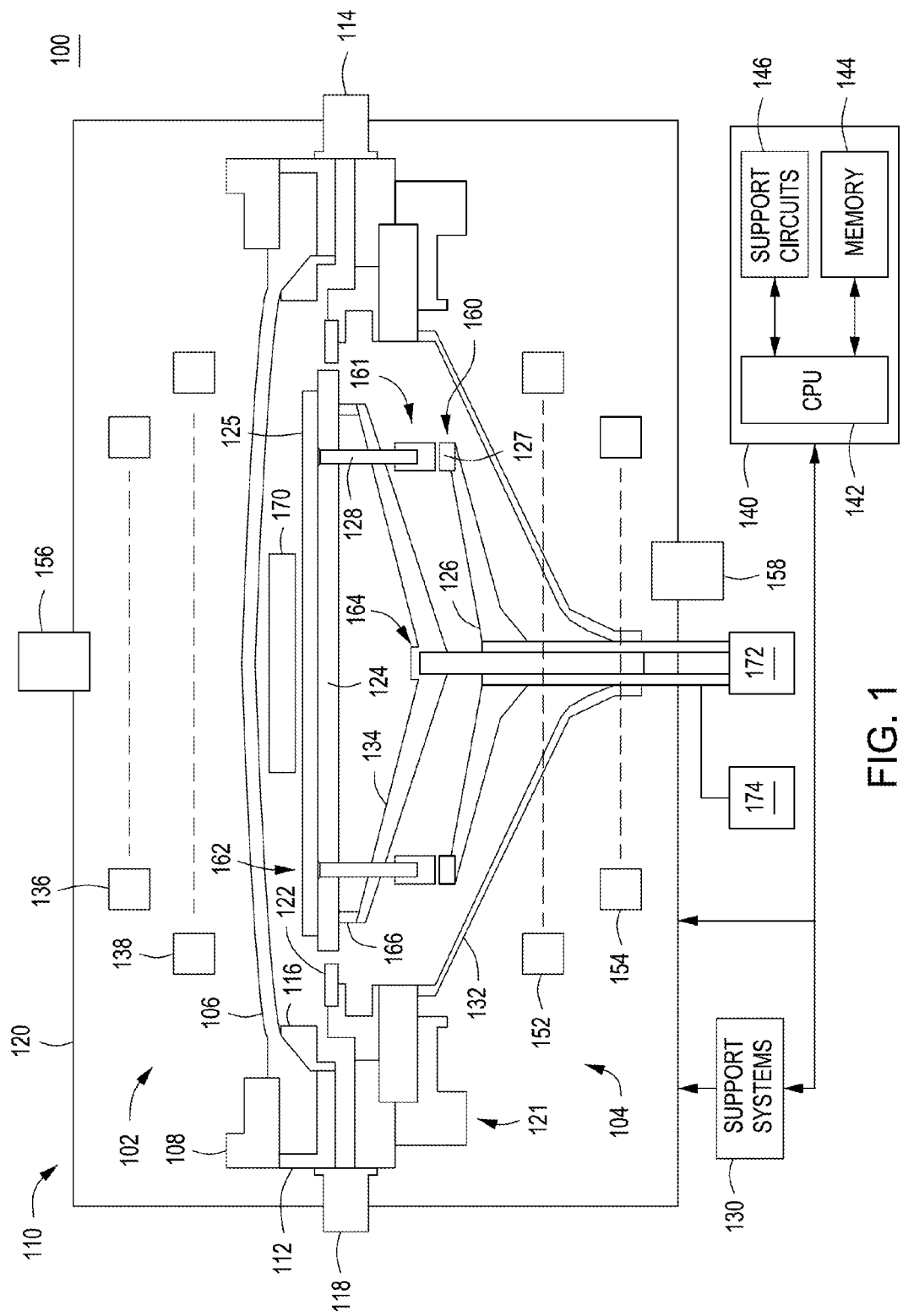
FIG. 1 depicts a schematic side view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for depositing a layer on a substrate are disclosed herein. The inventors have observed that undesirable thickness and/or compositional non-uniformities in epitaxial layers grown on a substrate surface may still exist during conventional processes. The inventors have further observed that such non-uniformities in thickness and composition may become even more undesirable at smaller critical dimensions and/or higher degrees of compositional loading. Embodiments of the inventive methods and apparatus disclosed herein may advantageously overcome thickness and/or compositional non-uniformities in deposited layers by generating a flow interaction between process gases utilized for deposition. The inventive methods and apparatus further reduce defect/particle formation in the deposited layer, allow for the tailoring of thickness and/or composition and/or crystallinity of the deposited layer.

FIG. 1 depicts a schematic side view of a process chamber 100 in accordance with some embodiments of the present invention. The process chamber 100 may be modified from a commercially available process chamber, such as the RP EPI® reactor, available from Applied Materials, Inc. of Santa Clara, Calif., or any suitable semiconductor process chamber adapted for performing epitaxial silicon deposition processes. The process chamber 100 may be adapted for performing epitaxial silicon deposition processes as discussed above and illustratively comprises a chamber body 110, and a first inlet port 114, a second inlet port 170, and an exhaust port 118 disposed about a substrate support 124. The first inlet port 114 and the exhaust port 118 are disposed on opposing sides of the substrate support 124. The second inlet port 170 is configured with respect to the first inlet port 114 to provide a second process gas at an angle to a first process gas provided by the first inlet port 114. The second inlet port 170 and the first inlet port 114 can be separated by an azimuthal angle 202 of up to about 145 degrees on either side of the chamber, described below with respect to FIG. 2A, which illustrates a top view of the process chamber 100. The process chamber 100 further includes support systems 130, and a controller 140, discussed in more detail below.

The chamber body 110 generally includes an upper portion 102, a lower portion 104, and an enclosure 120. The upper portion 102 is disposed on the lower portion 104 and includes a lid 106, a clamp ring 108, a liner 116, a baseplate 112, one or more upper lamps 136 and one or more lower lamps 138, and an upper pyrometer 156. In one embodiment, the lid 106 has a dome-like form factor, however, lids having other form factors (e.g., flat or reverse curve lids) are also contemplated. The lower portion 104 is coupled to a first inlet port 114, a second inlet port 170 and an exhaust port 118 and comprises a baseplate assembly 121, a lower dome 132, the substrate support 124, a pre-heat ring 122, a substrate lift assembly 160, a substrate support assembly 164, one or more upper lamps 152 and one or more lower lamps 154, and a lower pyrometer 158. Although the term "ring" is used to describe certain components of the process chamber, such as the pre-heat ring 122, it is contemplated that the shape of these components need not be circular and may include any shape, including but not limited to, rectangles, polygons, ovals, and the like.

Figure 2A:
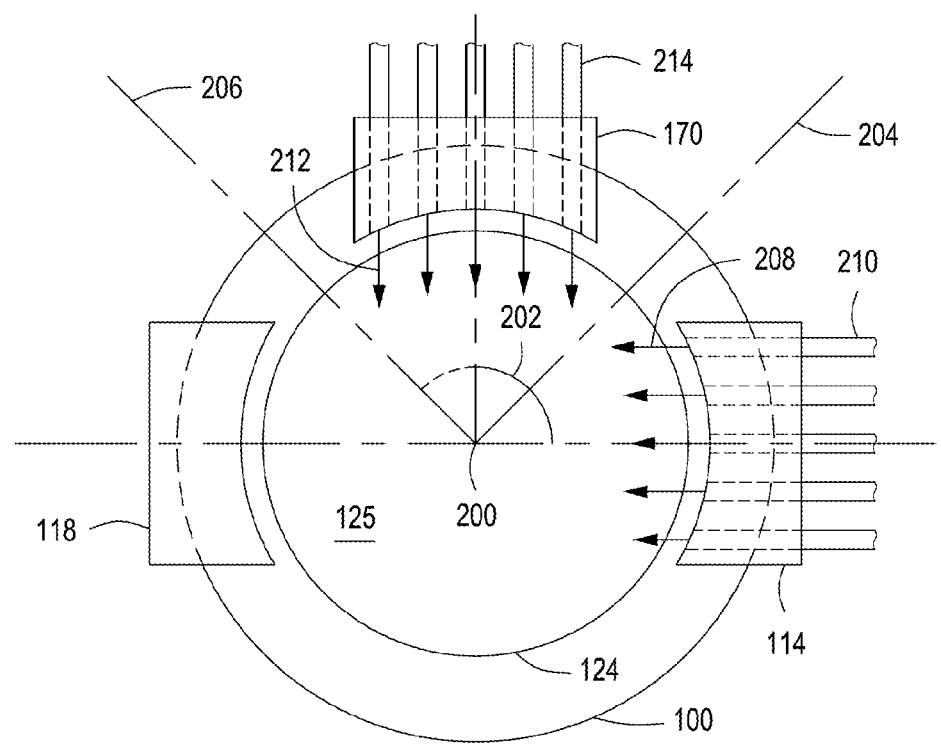
FIG. 2A depicts a schematic top view of a process chamber in accordance with some embodiments of the present invention.

FIG. 2A depicts a schematic top view of the chamber 100. As illustrated, the first inlet port 114, the second inlet port 170, and the exhaust port 118 are disposed about the substrate support 124. The exhaust port 118 may be disposed on an opposing side of the substrate support 124 from the first inlet port 114 (e.g., the exhaust port 118 and the first inlet port 114 are generally aligned with each other). The second inlet port 170 may be disposed about the substrate support 124, and in some embodiments (as shown), opposing neither the exhaust port 118 or the first inlet port 114. However, the positioning of the second inlet port 170 in FIG. 2A is merely exemplary and other positions about the substrate support 124 are possible as discussed below.

The first inlet port 114 is configured to provide a first process gas over a processing surface of the substrate 125 in a first direction 208. As used herein, the term process gas refers to both a singular gas and a mixture of multiple gases. Also as used herein, the term "direction" can be understood to mean the direction in which a process gas exits an inlet port. In some embodiments, the first direction 208 is parallel to the processing surface of the substrate 125 and generally pointed towards the opposing exhaust port 118.

The first inlet port 114 may comprise a single port wherein the first process gas is provided therethrough (not shown), or may comprise a first plurality of secondary inlets 210. In some embodiments, the number of secondary inlets 210 in the first plurality is up to about 5 inlets, although greater or fewer secondary inlets may be provided (e.g., one or more). Each secondary inlet 210 may provide the first process gas, which may for example be a mixture of several process gases. Alternatively, one or more secondary inlets 210 may provide one or more process gases that are different than at least one other secondary inlet 210. In some embodiments, the process gases may mix substantially uniformly after exiting the first inlet port 114 to form the first process gas. In some embodiments, the process gases may generally not mix together after exiting the first inlet port 114 such that the first process gas has a purposeful, non-uniform composition. Flow rate, process gas composition, and the like, at each secondary inlet 210 may be independently controlled. In some embodiments, some of the secondary inlets 210 may be idle or pulsed during processing, for example, to achieve a desired flow interaction with a second process gas provided by the second inlet port 170, as discussed below. Further, in embodiments where the first inlet port 114 comprises a single port, the single port may be pulsed for similar reasoning as discussed above.

The second inlet port 170 may be substantially similar in design to the first inlet port 114. The second inlet port 170 is configured to provide a second process gas in a second direction 212 different from the first direction 208. The second inlet port 170 may comprise a single port (as schematically shown in FIG. 1). Alternatively, the second inlet port may 170 comprise a second plurality of secondary inlets 214. Each secondary inlet 214 may provide the second process gas, which may for example be a mixture of several process gases. Alternatively, one or more secondary inlets 214 may provide one or more process gases that are different than at least one other secondary inlets 214. In some embodiments, the process gases may mix substantially uniformly after exiting the second inlet port 170 to form the second process gas. In some embodiments, the process gases may generally not mix together after exiting the second inlet port 170 such that the second process gas has a purposeful, non-uniform composition. Flow rate, process gas composition, and the like, at each secondary inlet 210 may be independently controlled. In some embodiments, the second inlet port 170, or some or all of the secondary inlets 214, may be idle or pulsed during processing, for example, to achieve a desired flow interaction with the first process gas provided by the first inlet port 114.

In some embodiments, a relationship between the first direction 208 of the first inlet port 114 and the second direction 212 of the second inlet port 170 can be at least partially defined by an azimuthal angle 202. The azimuthal angle 202 is measured between the first direction 208 and the second direction 212 with respect to a central axis 200 of the substrate support 124. The azimuthal angle 202 may be up to about 145 degrees, or between about 0 to about 145 degrees. In some embodiments, as shown by line 204, the azimuthal angle 202 may be less than 90 degrees resulting in a location of the second inlet port 170 that is in a closer proximity to the first inlet port 114 than to the exhaust port 118. In some embodiments, as shown by line 206, the azimuthal angle 202 may be greater than 90 degrees resulting in a location of the second inlet port 170 that is in a closer proximity to the exhaust port 118 than to the first inlet port 114. In some embodiments, and as illustrated in FIG. 2A, the azimuthal angle 202 is about 90 degrees. The azimuthal angle 202 may be selected to provide a desired amount of cross-flow interaction between the first and second process gases.

Figure 2B:
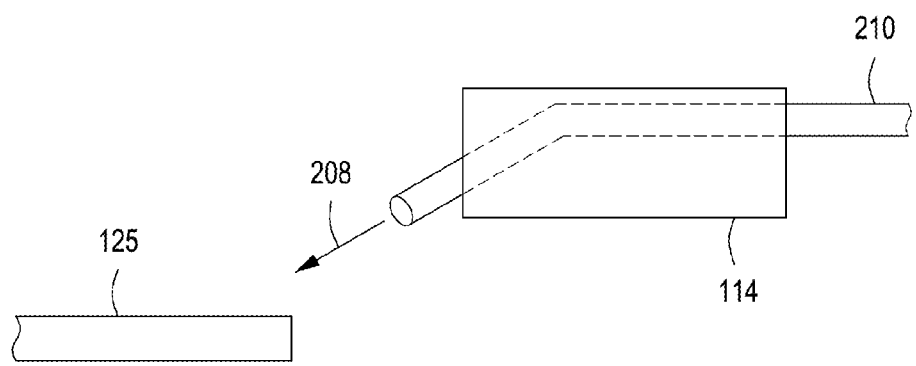
FIG. 2B depicts an inlet port in accordance with some embodiments of the present invention.

Either or both of the first and second directions 208, 212 may be substantially parallel to the processing surface of the substrate 125, or at an angle with respect to the processing surface of the substrate 125 (as shown in FIG. 2B). As illustrated in FIG. 2B, the first inlet port 114 can have one or more secondary inlets 210 oriented such that the first direction 208 is at an angle with respect to the processing surface of the substrate 125. The second inlet port 170 (not shown in FIG. 2B) may have a similar configuration orienting one or more of the secondary inlets 214 such that the second direction 212 is at an angle with respect to the processing surface of the substrate 125.

In some embodiments, the second direction 212 may be angled with respect to the substrate surface and the first direction 208 is parallel to the substrate surface. In such an embodiment, the azimuthal angle 202 may be up to about 145 degrees. In one specific example (not shown) of such an embodiment, the azimuthal angle is zero degrees. Accordingly, the first and second inlet ports 114, 170 may be disposed in vertical alignment, for example, stacked atop each other or integrated into a single unit. In such embodiments, the first and second directions 208, 212 are still different (even though the azimuthal angle 202 between them is zero degrees) due to the angled orientation of the second direction 212 and the parallel orientation of the first direction 208 with respect the substrate surface. Accordingly, a flow interaction can occur between the first and second process gases.

In some embodiments, the azimuthal angle defines the difference between the first and second directions 208, 212. For example, where the first and second direction 208, 212 are both parallel to the substrate surface, the azimuthal angle 202 is non-zero such that the first and second direction 208, 212 are different, and thus a flow interaction can be achieved.

Figure 2C:
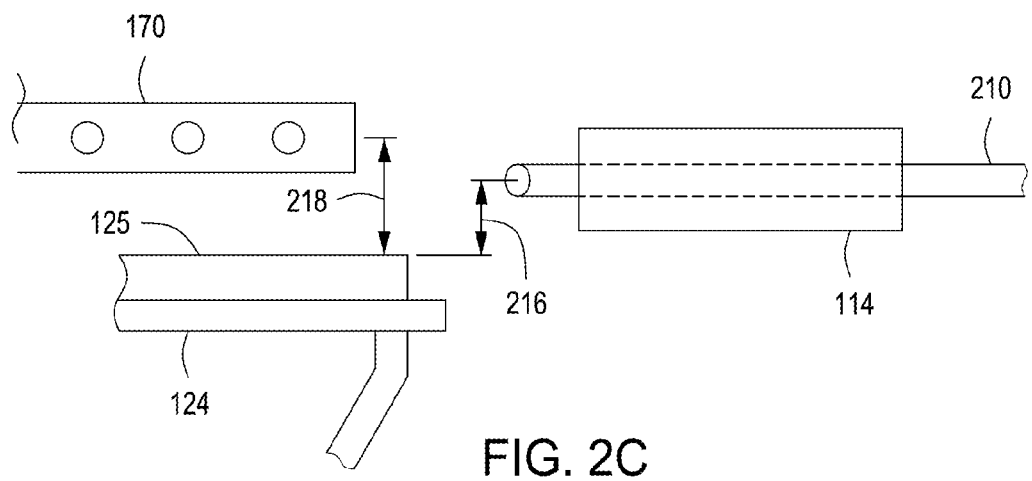
FIG. 2C depicts a schematic side view of a process chamber in accordance with some embodiments of the present invention.

In some embodiments, as illustrated in FIG. 2C, the first inlet port 114 may be disposed at a first height 216 and the second inlet port may be disposed at a second height 218 above the processing surface of the substrate 125. The first and second heights 216, 218 may be adjustable, for example, each height may be set prior to processing the substrate 125 in the chamber 100, or each inlet port 114, 170 may mounted on a movable platform (not shown), or the substrate support assembly 164 may be moved along the central axis 200 to adjust the first and second height 216, 218 (for example, where the substrate support assembly 164 is vertically movable to place the substrate 125 in different processing planes). In some embodiments, the second height 216 of the second inlet port 170 is greater than the first height 218 of the first inlet port 114. In such embodiments, the second direction 212 may be parallel to or angled with respect to the substrate surface (not shown in FIG. 2C).

Returning to FIG. 1, the substrate support assembly 164 generally includes a support bracket 134 having a plurality of support pins 166 coupled to the substrate support 124. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion of the lift pin 128 is movably disposed through a first opening 162 in the substrate support 124. In operation, the substrate lift shaft 126 is moved to engage the lift pins 128. When engaged, the lift pins 128 may raise the substrate 125 above the substrate support 124 or lower the substrate 125 onto the substrate support 124.

The substrate support 124 further includes a lift mechanism 172 and a rotation mechanism 174 coupled to the substrate support assembly 164. The lift mechanism 172 can be utilized for moving the substrate support 124 along the central axis 200. The rotation mechanism 174 can be utilized for rotating the substrate support 124 about the central axis 200.

During processing, the substrate 125 is disposed on the substrate support 124. The lamps 136, 138, 152, and 154 are sources of infrared (IR) radiation (i.e., heat) and, in operation, generate a pre-determined temperature distribution across the substrate 125. The lid 106, the clamp ring 116, and the lower dome 132 are formed from quartz; however, other IR-transparent and process compatible materials may also be used to form these components.

The support systems 130 include components used to execute and monitor pre-determined processes (e.g., growing epitaxial silicon films) in the process chamber 100. Such components generally include various sub-systems. (e.g., gas panel(s), gas distribution conduits, vacuum and exhaust subsystems, and the like) and devices (e.g., power supplies, process control instruments, and the like) of the process chamber 100. These components are well known to those skilled in the art and are omitted from the drawings for clarity.

The controller 140 generally comprises a central processing unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

The inventive chamber 100 has been described above; however, other embodiments of the chamber have been conceived by the inventors for generating a cross flow interaction between the first and second process gases. For example, the chamber 100 may be configured to include a second exhaust port (not shown) instead of the second inlet port 170 as shown. For example, the position of the second exhaust port could be defined by the azimuthal angle 202 similar to how the azimuthal angle 202 defines the relationship between the first and second flow directions 208, 212. In such an example, both the first and second process gases may be flowed from the first inlet port 114 and a flow interaction created by the asymmetry of the first and second exhaust ports with respect to the first inlet port.

Figure 3:
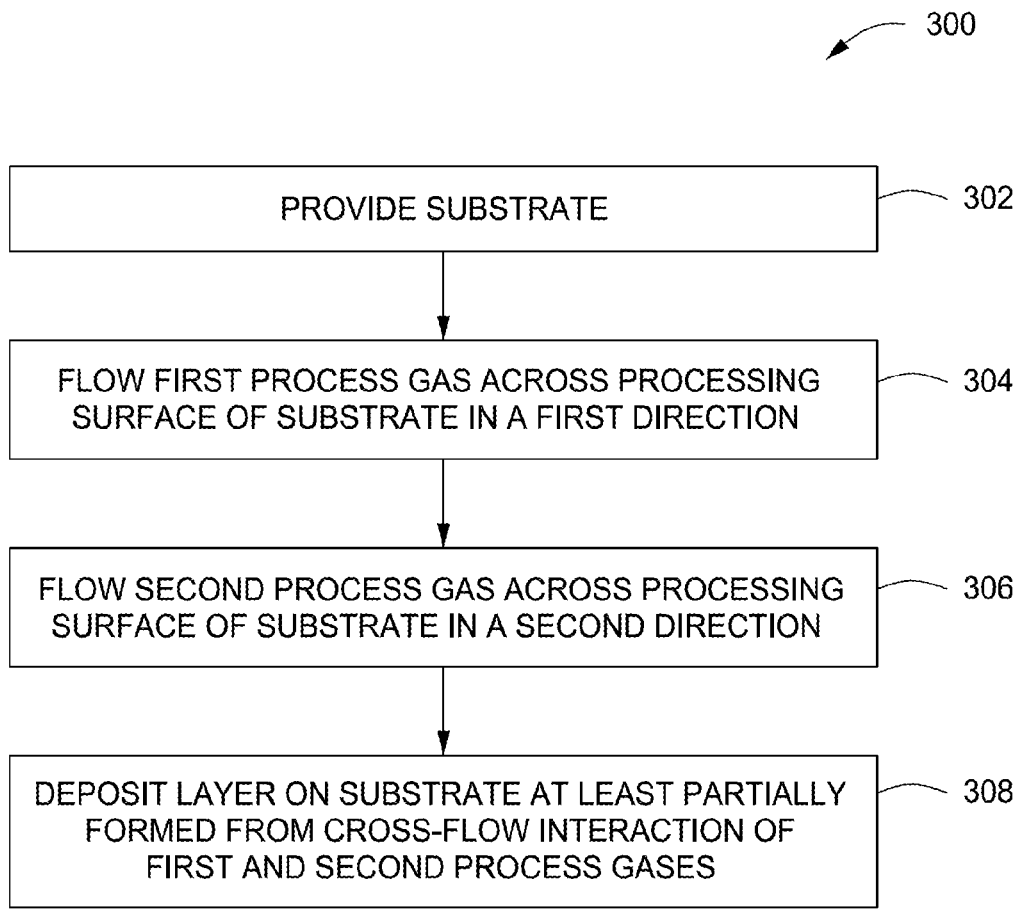
FIG. 3 depicts a flow chart for method for depositing a layer on a substrate in accordance with some embodiments of the present invention.

FIG. 3 depicts a flow chart for a method for depositing a layer on a substrate in accordance with some embodiments of the present invention. The method 300 is described below with respect to the embodiments of the chamber 100 described above.

The method 300 begins at 302 by providing a substrate, such as the substrate 125. The substrate 125 may comprise a suitable material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. Further, the substrate 125 may comprise multiple layers, or include, for example, partially fabricated devices such as transistors, flash memory devices, and the like.

At 304, the first process gas may be flowed across the processing surface of the substrate 125 in a first direction, for example, the first direction 208. The first process gas may be flowed from the first inlet port 114, or from one or more of the secondary inlets 210, in the first direction 208 and across the processing surface towards the exhaust port 118. The first process gas may be flowed from the first inlet port 114 in the first direction 208 parallel to the processing surface or at an angle thereto.

The first process gas may comprise one or more process gases. For example, the process gases may include deposition and/or etching gases, such as for a selective epitaxial growth process, and the like. In some embodiments, the first process gas may include one or more deposition gases, and optionally, one or more of a dopant precursor gas, an etchant gas, or a carrier gas. The deposition gas may include a silicon precursor such as at least one of silane ($SiH_4$), disilane ($Si_2H_6$), dichlorosilane ($H_2SiCl_2$). The dopant precursor gas may include at least one of germane ($GeH_4$), phosphine ($PH_3$), diborane ($B_2H_6$), arsine ($AsH_3$), or methylsilane ($H_3CSiH_3$). The etchant gas may include at least one of methane $CH_4$, hydrogen chloride (HCl), chlorine ($Cl_2$), or hydrogen fluoride (HF). The carrier gas may include at least one of nitrogen ($N_2$), argon (Ar), helium (He), or hydrogen ($H_2$).

In some embodiments, for example for depositing a layer comprising silicon and germanium, the first process gas may include dichlorosilane ($H_2SiCl_2$), germane ($GeH_4$), diborane ($B_2H_6$), and hydrogen ($H_2$). In some embodiments, for example, to deposit a layer of silicon, the first process gas may include at least one of silane ($SiH_4$), disilane ($Si_2H_6$), or dichlorosilane ($H_2SiCl_2$), along with hydrogen chloride (HCl) and hydrogen ($H_2$). In some embodiments, for example, where the deposition layer comprises doped silicon, the first process gas may include the above gases and may further include at least one of phosphine ($PH_3$), diborane ($B_2H_6$), or arsine ($AsH_3$). In some embodiments, where the deposition layer comprises silicon and carbon, the first process gas may comprise disilane ($Si_2H_6$), methylsilane ($H_3CSiH_3$), germane ($GeH_4$), phosphine ($PH_3$), and at least one of hydrogen chloride (HCl) or chlorine ($Cl_2$) in an environment comprising at least one of nitrogen ($N_2$) or hydrogen ($H_2$)).

At 306, the second process gas may be flowed across the processing surface of the substrate 125 in a second direction, for example, the second direction 212. As discussed above in accordance with the embodiments of the chamber 100, the second direction 212 is different from the first direction 208 to promote a flow interaction between the first and second process gases. The second direction 212 may be made different from the first direction 208 by either a non-zero azimuthal angle 202, providing the second process gas at an angle to the substrate surface (as shown in FIG. 2B), or a combination thereof. The difference in the first and second directions 208, 212 may be utilized to create a flow interaction between the first and second process gases which can improve thickness and/or compositional uniformity in the deposited layer across the processing surface of the substrate.

The second process gas may be the same or different from the first process gas. The second process gas may include any or all combinations of those gases discussed above for the first process gas (e.g., combinations of the deposition gases, etchant gases, dopant precursor gases, and carrier gases). In some embodiments, for example during a selective epitaxial growth process, the second process gas may include etchant gases, deposition gases, or a combination thereof. The second process gas may be flowed alternately, periodically, partially concurrently, or concurrently with the first process gas. In some embodiments, the second process gas may be flowed at the same time with the first process gas, such that steps 304 and 306 are performed concurrently.

In some embodiments, the second process gas may be different from the first, for example, to improve compositional uniformity in the deposited layer (discussed at 308 below). In some embodiments, for example for depositing a layer comprising silicon and germanium, the second process gas may include dichlorosilane ($H_2SiCl_2$), germane ($GeH_4$), diborane ($B_2H_6$), hydrogen chloride (HCl), and hydrogen ($H_2$).

In some embodiments, the second process gas may be different from the first, for example, by providing a catalyst gas that catalyzes the first process gas. For example, such catalyzation may improve compositional uniformity and/or thickness of a layer deposited on the substrate. The second process gas may include the catalyst and other gases, for example, such as the silanes and/or germanes listed above. Exemplary catalysts may include germane ($GeH_4$).

Figure 4:
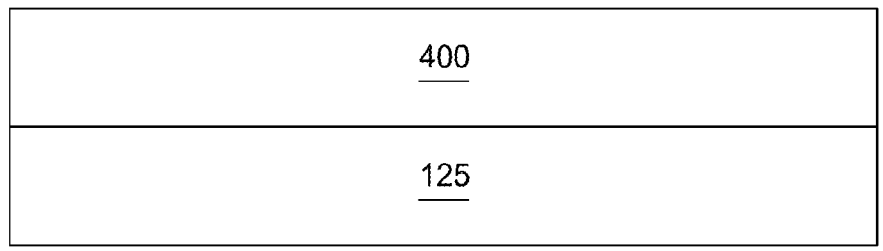
FIG. 4 depicts a layer deposited on a substrate in accordance with the method depicted in FIG. 3.

At 308, a layer 400 (shown in FIG. 4) is deposited atop the substrate 125 at least partially from the flow interaction of the first and second process gases. In some embodiments, the layer 400 may have a thickness between about 1 to about 10,000 nanometers. In some embodiments, the layer 400 comprises silicon and germanium. The concentration of germanium in the layer 400 may be between about 5 to about 100 atomic percent (i.e., germanium only). In one specific embodiment, the layer 400 is a silicon germanium (SiGe) layer having a germanium concentration of between about 25 to about 45 atomic percent.

As noted above, the layer 400 is deposited at least partially by the flow interaction between the first and second process gases flowed in the different flow directions 208, 212. While not wishing to be bound by theory, the inventors believe that for some configurations, for example, having an azimuthal angle 202 of about 90 degrees, the deposition proximate the peripheral edge of the substrate predominantly occurs via a cross-flow interaction between the two process gases, while, the deposition proximate the center of the substrate (near central axis 200) may be predominantly deposited via the first process gas. At other configurations, for example, having an azimuthal angle 202 of about zero degrees, the deposition may occur completely via the flow interaction between the first and second process gases.

The layer 400 may be deposited by one or more processing methods. For example, the flow rates of the first and second process gases may be varied to tailor the thickness and/or composition of the layer 400. Further, the flow rates may be varied to adjust crystallinity of the layer. For example, a higher flow rate may improve crystallinity of the layer. Other process variants can include rotating about and/or moving the substrate 125 along the central axis 200 while one or both of the first and second process gases are flowing. For example, in some embodiments, the substrate 125 is rotated while one or both of the first and second process gases are flowing. For example, in some embodiments, the substrate 125 is moved along the central axis 200 while one or both of the first and second process gases are flowing to adjust the flow rates of each process gas.

Other variants of depositing the layer are possible. For example, the first and second process gases may be pulsed in one of an alternating or cyclical pattern. In some embodiments, selective epitaxial growth of the layer may be performed by alternately pulsing deposition and etch gases from either or both of the first and second inlet ports 114, 170. Further, pulsing of the first and second process gases could occur in combination with other processing methods. For example, a first pulse of one or both of the first and second process gases may occur at a first substrate position along the central axis 200, and then a second pulse of one or both of the first and second process gases may occur at a second substrate position along the central axis 200. Further, pulsing can occur with the substrate is rotating about the central axis 200.

Thus, methods and apparatus for depositing a layer on a substrate have been disclosed herein. The inventive methods and apparatus advantageously overcome thickness and/or compositional non-uniformities the deposited layer by generating a flow interaction between process gases utilized for deposition. The inventive methods and apparatus further reduce defect/particle formation in the deposited layer, and allow for the tailoring of thickness and/or composition and/or crystallinity of the deposited layer.

While the foregoing is directed to embodiments of the present invention, other and further embodiments of the invention may be devised without departing from the basic scope thereof.

The invention claimed is:

1. An apparatus for processing a substrate, comprising:
    a process chamber having a substrate support disposed therein to support a processing surface of a substrate at a desired position within the process chamber;
    a first inlet port to direct an initial flow of a first process gas over the processing surface of the substrate from one end of the substrate towards an opposite end of the substrate in a first direction;
    a second inlet port to direct an initial flow of a second process gas over the processing surface of the substrate in a second direction having an azimuthal angle greater than zero with respect to the first direction, wherein the azimuthal angle measured between the first direction and the second direction with respect to a central axis of the substrate support is up to about 145 degrees, and wherein the second direction is angled towards the processing surface; and an exhaust port disposed opposite the first inlet port to exhaust the first and second process gases from the process chamber.

2. The apparatus of claim 1, wherein the azimuthal angle is about 90 degrees.

3. The apparatus of claim 1, wherein a height of either or both of the first inlet port and the second inlet port with respect to the processing surface is adjustable.

4. An apparatus for processing a substrate, comprising:
a process chamber having a substrate support disposed therein to support a processing surface of a substrate at a desired position within the process chamber;
a first inlet port to direct an initial flow of a first process gas over the processing surface of the substrate from one end of the substrate towards an opposite end of the substrate in a first direction;
a second inlet port to direct an initial flow of a second process gas over the processing surface of the substrate in a second direction having an azimuthal angle greater than zero with respect to the first direction, wherein the azimuthal angle measured between the first direction and the second direction with respect to a central axis of the substrate support is up to about 145 degrees, wherein a height of the second inlet port with respect to the processing surface is greater than a height of the first inlet port with respect to the processing surface; and
an exhaust port disposed opposite the first inlet port to exhaust the first and second process gases from the process chamber.

5. The apparatus of claim 1, wherein the substrate support is further movably disposed within the process chamber to support the processing surface of the substrate at a plurality of desired positions along an axis perpendicular to the processing surface.

6. The apparatus of claim 1, wherein either or both of:
the first inlet port further comprises a first plurality of secondary inlets, each capable of delivering the first process gas; or
the second inlet port further comprises a second plurality of secondary inlets, each capable of delivering the second process gas.

7. The apparatus of claim 6, wherein at least one secondary inlet in the first plurality can provide a different composition of the first process gas than at least one other secondary inlet in the first plurality and/or wherein at least one secondary inlet in the second plurality can provide a different composition of the second process gas than at least one other secondary inlet in the second plurality.

8. The apparatus of claim 7, wherein both of the first and second inlet ports further comprise the respective first and second pluralities of secondary inlets and wherein both of the first and second pluralities of secondary inlets include at least one secondary inlet that can provide a different composition of the first or second process gas.

9. The apparatus of claim 6, wherein both of the first and second inlet ports further comprise the respective first and second plurality of secondary inlets.

10. The apparatus of claim 6, wherein a flow rate of a process gas from each secondary inlet of the first and/or second plurality is independently adjustable.

11. The apparatus of claim 1, further comprising:
a rotation mechanism coupled to the substrate support to rotate the substrate support about the central axis; and
a lifting mechanism coupled to the substrate support to move the substrate support along the central axis.

12. A method for depositing a layer on a substrate, comprising:
directing an initial flow of a first process gas across a processing surface of a substrate from one end of the substrate towards an opposite end of the substrate in a first direction;
directing an initial flow of a second process gas across the processing surface of the substrate in a second direction having an azimuthal angle greater than zero with respect to the first direction, wherein the azimuthal angle measured between the first direction and the second direction with respect to a central axis of the substrate is up to about 145 degrees, and wherein the second flow direction is angled towards the processing surface; and
depositing a layer at least partially formed from a crossflow interaction of the first and second process gases on the substrate.

13. The method of claim 12, wherein the first and second process gases each comprise:
a deposition gas including at least one of silane ($SiH_4$), disilane ($Si_2H_6$), or dichlorosilane ($H_2SiCl_2$);
a dopant precursor gas including at least one of methylsilane ($H_3CSiH_3$), germane ($GeH_4$), phosphine ($PH_3$), diborane ($B_2H_6$), or arsine ($AsH_3$);
an etchant gas including one or more of methane ($CH_4$), hydrogen chloride (HCl), chlorine ($Cl_2$), or hydrogen fluoride (HF); and
a carrier gas including at least one of nitrogen ($N_2$), argon (Ar), helium (He), or hydrogen ($H_2$).

14. The method of claim 12, wherein the first process gas comprises at least one of dichlorosilane ($H_2SiCl_2$) or silane ($SiH_4$), and further comprising germane ($GeH_4$), diborane ($B_2H_6$), hydrogen chloride (HCl), and hydrogen ($H_2$), and wherein the second process gas comprises dichlorosilane ($H_2SiCl_2$), germane ($GeH_4$), diborane ($B_2H_6$), hydrogen chloride (HCl), and hydrogen ($H_2$).

15. The method of claim 12, wherein the first and second process gas are different.

16. The method of claim 12, further comprising one or more of:
rotating the substrate about the central axis while flowing at least one of the first or second process gases; or
moving the substrate along the central axis while flowing at least one of the first or second process gases.

17. The method of claim 12, wherein the first and second process gases are pulsed in one of an alternative or cyclical pattern or wherein the first and second process gases are flowed simultaneously.

18. The method of claim 12, wherein the layer comprises silicon and germanium.

* * * * *